(12) United States Patent
Takeda et al.

(10) Patent No.: US 8,202,677 B2
(45) Date of Patent: *Jun. 19, 2012

(54) CHEMICALLY-AMPLIFIED POSITIVE RESIST COMPOSITION AND PATTERNING PROCESS THEREOF

(75) Inventors: Takanobu Takeda, Jyoetsu (JP); Satoshi Watanabe, Jyoetsu (JP); Youichi Ohsawa, Jyoetsu (JP); Masaki Ohashi, Jyoetsu (JP); Takeshi Kinsho, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 194 days.

This patent is subject to a terminal disclaimer.

(21) Appl. No.: 12/457,327

(22) Filed: Jun. 8, 2009

(65) Prior Publication Data

US 2010/0009286 A1 Jan. 14, 2010

(30) Foreign Application Priority Data

Jul. 11, 2008 (JP) ................................. 2008-181787

(51) Int. Cl.
*G03F 7/00* (2006.01)
*G03F 7/04* (2006.01)
*G03F 7/028* (2006.01)
*G03F 7/40* (2006.01)

(52) U.S. Cl. ..................... 430/270.1; 430/311; 430/330; 430/331; 430/913; 430/322

(58) Field of Classification Search .............. 430/270.1, 430/311, 330, 331, 913, 322
See application file for complete search history.

(56) References Cited

U.S. PATENT DOCUMENTS 5,492,793 A 2/1996 Breyta et al.
(Continued)

FOREIGN PATENT DOCUMENTS

EP 1684118 A1 * 7/2006
(Continued)

OTHER PUBLICATIONS

Written Opinion issued in corresponding Singaporean Application No. 2009040247, issued Aug. 4, 2010.
(Continued)

*Primary Examiner* — Amanda C. Walke
(74) *Attorney, Agent, or Firm* — Oliff & Berridge, PLC

(57) ABSTRACT

There is disclosed a chemically-amplified positive resist composition comprising, as main components, (A) a base polymer, which contains one or more kinds of a monomer unit represented by the following general formula (1) and the like, and is an alkali-insoluble polymer whose hydroxyl group is partly protected by an acetal group while alkali-soluble when deprotected by an acid catalyst, (B) a sulfonium salt containing a sulfonate anion, (C) a basic component, and (D) an organic solvent. In a lithography technology by a photo resist, an extremely high temporal stability is necessary. In addition, it must give a good pattern profile not dependent on a substrate and have a high resolution power. There can be provided a chemically-amplified positive resist composition which can solve these problems simultaneously, a resist patterning process using the same, and a method for producing a photo mask blank.

(1)

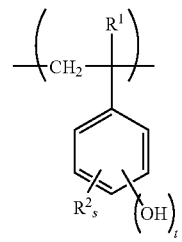

24 Claims, 1 Drawing Sheet

U.S. PATENT DOCUMENTS

| | | | |
|---|---|---|---|
| 5,650,483 | A | 7/1997 | Malik et al. |
| 6,733,951 | B2 * | 5/2004 | Kodama ............... 430/270.1 |
| 7,109,311 | B2 * | 9/2006 | Ohsawa et al. ............ 534/558 |
| 7,267,923 | B2 * | 9/2007 | Takeda et al. ............ 430/270.1 |
| 7,282,305 | B2 * | 10/2007 | Shoki et al. ............... 430/5 |
| 7,335,458 | B2 * | 2/2008 | Ohsawa et al. ............ 430/270.1 |
| 7,374,860 | B2 * | 5/2008 | Hirano et al. ............ 430/270.1 |
| 7,501,223 | B2 * | 3/2009 | Takeda et al. ............ 430/270.1 |
| 7,541,131 | B2 * | 6/2009 | Kawanishi ............ 430/270.1 |
| 7,618,763 | B2 * | 11/2009 | Takeda et al. ............ 430/270.1 |
| 7,704,668 | B1 * | 4/2010 | Cameron et al. ............ 430/270.1 |
| 7,851,130 | B2 * | 12/2010 | Kawanishi et al. ........ 430/270.1 |
| 7,887,991 | B2 * | 2/2011 | Hatakeyama et al. ..... 430/270.1 |
| 2006/0216635 | A1 | 9/2006 | Hirano et al. |
| 2007/0037091 | A1 | 2/2007 | Koitabashi et al. |
| 2007/0105042 | A1 | 5/2007 | Takeda et al. |
| 2007/0231738 | A1 | 10/2007 | Kaneko et al. |
| 2008/0090179 | A1 | 4/2008 | Takeda et al. |
| 2010/0009271 | A1 * | 1/2010 | Takeda et al. .................... 430/5 |

FOREIGN PATENT DOCUMENTS

| | | |
|---|---|---|
| EP | 1 783 551 A2 | 5/2007 |
| EP | 1783551 A2 * | 5/2007 |
| JP | A 62-240953 | 10/1987 |
| JP | A 6-266112 | 9/1994 |
| JP | A 2002-62652 | 2/2002 |
| JP | A-2002-244297 | 8/2002 |
| JP | A 2005-326833 | 11/2005 |
| JP | A 2007-132998 | 5/2007 |
| JP | A 2007-297590 | 11/2007 |
| JP | A 2007-304528 | 11/2007 |
| JP | 2008095009 A * | 4/2008 |
| JP | A 2008-95009 | 4/2008 |

OTHER PUBLICATIONS

Aug. 1, 2011 Office Action issued in Chinese Patent Application No. 200910140185.5 (with partial English-language translation).

Office Action issued in Chinese Patent Appln. No, 200910140185.5; mailed Feb. 23, 2012.

* cited by examiner

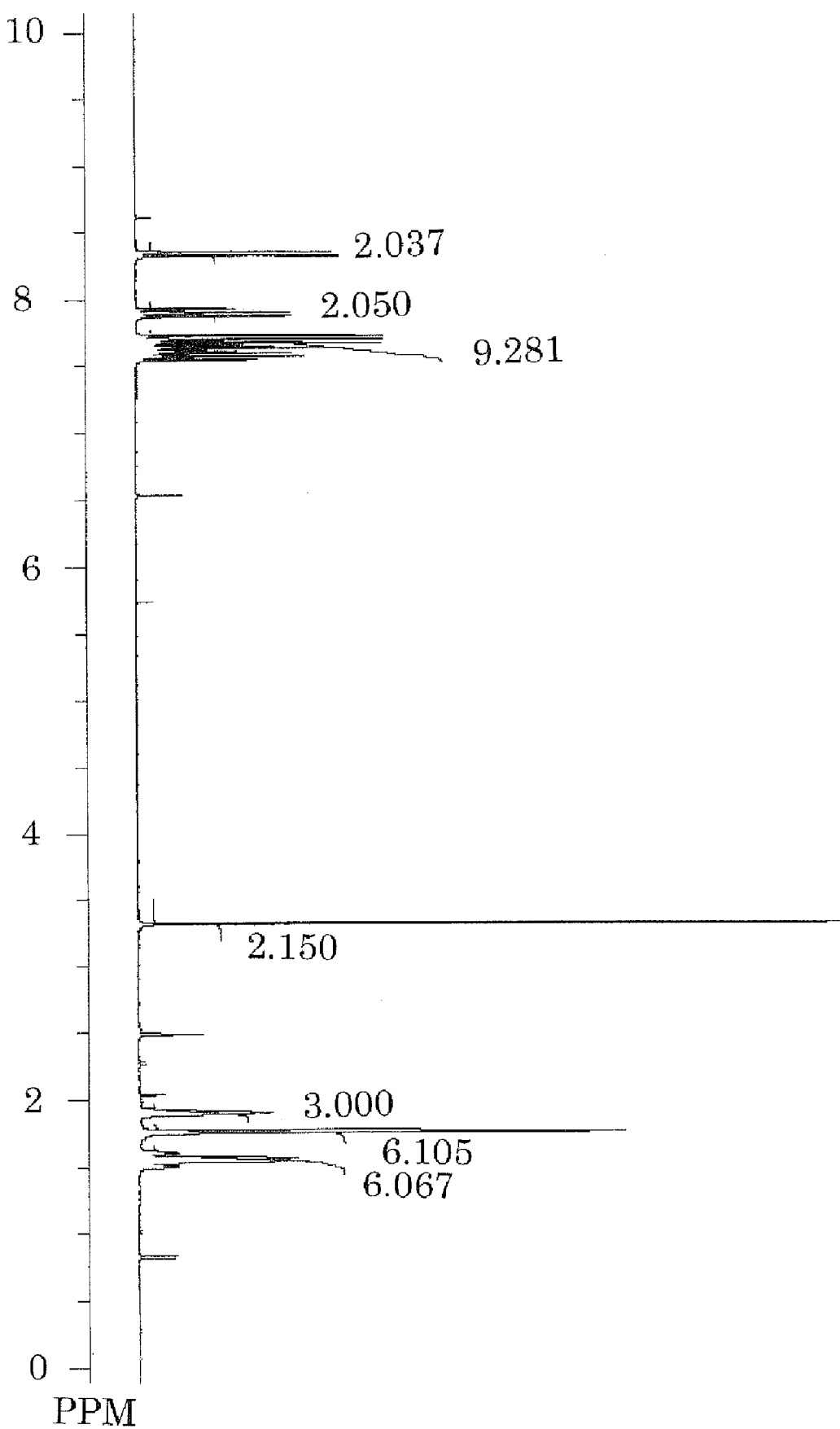

CHEMICALLY-AMPLIFIED POSITIVE RESIST COMPOSITION AND PATTERNING PROCESS THEREOF

BACKGROUND OF THE INVENTION

1. Field of the Invention

The present invention relates to a resist composition of a chemically-amplified which is used for processing of a semiconductor, a photo mask, and so forth, and responds to a high energy radiation such as an UV beam, a deep UV beam, an electron beam, an EUV, an X-ray, an excimer laser, a γ-beam, and a synchrotron beam, in particular to a resist composition of a chemically-amplified type used for a light-exposure by a beam exposure of a high energy radiation including an electron beam and a deep UV beam, and to a resist patterning process using the same.

2. Description of the Related Art

In recent years, as an integrated circuit progresses toward a higher integration, a further finer pattern formation is required, and a chemically-amplified type resist catalyzed by an acid has been mainly used in processing of a pattern with 0.2 micrometer or less. For this, high energy radiations such as an UV beam, a deep UV beam, and an electron beam are used as a light source, and especially an electron beam lithography used as a super fine miniaturization technology becomes indispensable also as a method for processing of a photo mask blank in preparation of a photo mask used for semiconductor manufacturing.

Generally, drawing by an electron beam is done by a beam of an electron beam, and in the case of a positive type without using a mask, a method in which a beam of an electron beam with a fine area is exposed sequentially on areas other than the areas to be remained in a resist film is employed. Accordingly, the operation is done in such a manner to drag on finely compartmentalized processing areas throughout the entire area, and thus the time is longer than a one-time exposure using a photo mask and thereby a high sensitivity resist is required in order not to sacrifice a throughput.

In addition, because of a longer drawing time, areas drawn in an early time and a later time tend to be different easily, and thus a temporal stability of an exposed area under vacuum is an important performance requirement item. Furthermore, in processing of a mask blanks which is an especially important application of it, there are some surface materials, like a film of a chrome compound including a chrome oxide that is laminated on a photo mask substrate, which tends to easily affect a pattern profile of a chemically-amplified type resist, and thus, in order to keep a high resolution and a form after etching, keeping a resist pattern profile in rectangular regardless of the kind of a substrate is also one of the important performance requirements.

Control of a resist sensitivity and a pattern profile as mentioned above has been improved by selecting materials used in a resist composition, a combination thereof, process conditions, and so forth. For example, in an early stage of the development, as to an acid catalyst to dissociate a protecting group of a resist polymer in a resist film of an chemically-amplified type, use of a super acid such as hexafluorcantimonic acid had been studied, and also a sulfonic acid having an increased acidity by a fluorine atom such as trifluoromethane sulfonic acid had been used, in order to obtain a rectangular profile and a high sensitivity.

In contrast, a camphor sulfonic acid which is a balky alkyl sulfonic acid not substituted by a fluorine atom had also been used from a relatively early time, in particular, in Japanese Patent Laid-Open Publication No. H6-266112, it is used with an aim to perform a catalytic reaction by using a relatively weak acid at high temperature.

On the other hand, in Japanese Patent Laid-Open Publication No. 2007-304528, a technology with which a line edge roughness is reduced, in an acrylic acid polymer protected by a tertiary alkyl group, by a combination of a highly acidic sulfonic acid containing a fluorine atom and a relatively low acidic alkyl sulfonic acid not containing a fluorine atom is disclosed, wherein use of a balky adamantyl sulfonic acid is disclosed as an example of the latter.

Furthermore, in a hyroxystyrene-type resist which is suitable for an electron beam lithography and the like, it is reported that a combination of a certain sulfonium and a benzenesulfonate having a substituent group is suitable as an acid generator such as shown in Japanese Patent Laid-Open Publication No. 2005-326833. Inventors of the present invention reported that a resist film may be made thinner by using a copolymer of hydroxystyrene and indene such as shown in Japanese Patent Laid-Open Publication No. 2008-95009 and Japanese Patent Laid-Open Publication No. 2007-132998.

SUMMARY OF THE INVENTION

As mentioned above, in a lithography technology of a photo resist, various problems have been solved by an accumulation of improvements in materials used in a resist composition. However, in an electron beam lithography, a high sensitivity that enables a use of an electron beam with a large acceleration voltage to give a further high resolution is required in order to increase a throughput as mentioned above.

In addition, because this high sensitivity is to achieve miniaturization of a pattern, the difference in line width obtained in an early time and in a later time of a light-exposure process needs to be extremely small. In other word, an extremely high temporal stability is needed. Furthermore, in order to apply the lithography for a photo mask blank, a pattern profile needs to be excellent regardless of a substrate. To have a high resolution power is the basic premise to solve the problems.

The present invention has an object to provide a resist composition that can address these problems simultaneously and a resist patterning process using the same, especially a patterning process on a photo mask blank.

Inventors of the present invention considered that, in order to address all of the afore-mentioned problems, namely, to obtain a high sensitivity, a temporal stability, and in addition, a high resolution, a proper design of materials used in a resist composition is important. In Japanese Patent Laid-Open Publication No. H6-266112, a design is made in such a way as to cause a catalytic reaction fully by raising a process temperature of a catalytic reaction by an acid generated even if a weak acid is used. In this case, however, if a high process temperature is adopted, a diffusion distance of an acid to cause an effective reaction in the catalytic reaction is too large to form a fine pattern with less than 0.1 micrometer, which is presently required for an electron beam lithography.

In the case of Japanese Patent Laid-Open Publication No. 2007-304528, it seems that a line edge roughness is improved by designing a region in which, with regard to a protecting group having a relatively low reactivity, a strong acid is not fully deactivated while a reaction itself is controlled to a certain degree. In this case, however, there is neither a strong effect to suppress the diffusion, nor a sufficient effect to suppress the change of a resist form on a surface of a chrome compound as mentioned above.

Inventors of the present invention daringly attempted to design a resist composition by a method using a polymer with a further higher sensitivity, even though it was an approach, which might lead to departure from a requirement of a temporal stability.

Namely, a research was made on a system comprising, as a polymer component, a polymer protected by an acetal group having a high reactivity and easily causing solubility change and an acid with a relatively low reactivity. Then, it was found surprisingly that when a copolymer, comprising an aromatic cyclic olefin such as those represented by the general formulae (2) and (3) and a styrenic monomer such as those represented by the general formula (1), and an acid generator generating an adamantly sulfonic acid were combined, requirements of a high sensitivity, an excellent temporal stability, a high resolution power, and a good pattern profile including a substrate dependency, which could not been obtained when an aromatic cyclic olefin was not used or an acid generator liberating a camphor sulfonic acid used as a relatively weak acid with low diffusion was used, could be all satisfied. As a result, the present invention could be accomplished.

Namely, the present invention is a chemically-amplified positive resist composition comprising, as its main components, at least (A) a base polymer containing one or more monomer unit represented by the following general formula (1) (however, it always contains a unit with t being one or more):

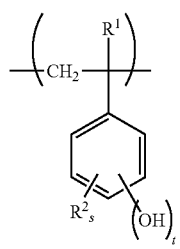

(1)

wherein $R^1$ represents a hydrogen atom or a methyl group; and $R^2$ represents an alkyl group, or an alkoxy group having 1 to 6 carbon atoms, wherein t represents an integer of 0 to 2; and s represents an integer of 0 to 4, and further, one or more monomer unit represented by the following general formula (2);

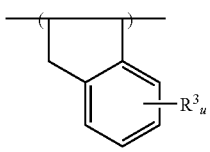

(2)

wherein $R^3$ represents any of a hydroxyl group, an alkyl group, and an alkoxy group having 1 to 6 carbon atoms, wherein u represents an integer of 0 to 4 and/or one or more monomer unit represented by the following general formula (3);

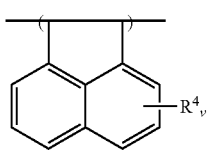

(3)

wherein $R^4$ represents any of a hydroxyl group, an alkyl group, and an alkoxy group having 1 to 6 carbon atoms, wherein v represents an integer of 0 to 4, wherein a hydroxyl group of the polymer is partly protected by an acetal group represented by the following general formula (4);

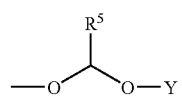

(4)

wherein $R^5$ represents a hydrogen atom, a linear, a branched, or a cyclic alkyl group having 1 to 10 carbon atoms; and Y represents a linear, a branched, or a cyclic (including a polycyclic) alkyl group having 1 to 30 carbon atoms and the polymer is insoluble or hardly soluble in an alkaline solution, while soluble in an alkaline solution when deprotected by an acid catalyst, (B) a sulfonium salt containing a sulfonate anion represented by the following general formula (5);

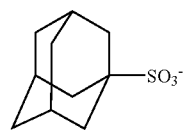

(5)

(C) a basic component, and
(D) an organic solvent.

A polymer in the component (A) is made soluble in an alkaline developer by eliminating a protecting group represented by the above general formula (4) by an acid, wherein a protecting group represented by the general formula (4) is highly sensitive to an acid and also an extremely acute with regard to a solubility change. In addition, owing to the presence of a polymer having a monomer unit represented by the above general formula (2) and/or the above general formula (3) and an acid generator having a counter anion represented by the above general formula (5), a high sensitivity and a high resolution are secured, and further, a good resist pattern profile including its substrate independency may be obtained, and yet a high temporal stability is secured.

In addition, surprisingly, the above general formula (5) clearly shows an improved and excellent property with regard to a subject of a substrate dependency which could not be improved by a camphor sulfonic acid or a substituted benzene sulfonic acid that have been used for the same purpose in the past.

There may be mentioned a chemically-amplified positive resist composition, characterized in that the composition contains a triaryl sulfonium salt represented by the following general formula (6) as an exemplary embodiment of a photo acid generator of component (B):

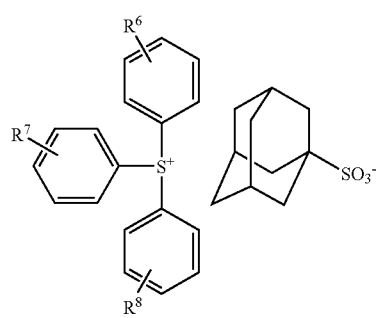

(6)

wherein $R^6$, $R^7$, and $R^8$ may be the same or different, and represent any of a hydrogen atom, a fluorine atom, a chlorine atom, a nitro group, a linear, a branched, or a cyclic alkyl group and an alkoxy group, substituted or unsubstituted, having 1 to 12 carbon atoms. Among $R^6$ to $R^8$, a pair of linkage chain is formed by combinations of two of them, and when the linkage chain is formed, it may be a single bond or an ether bond.

There may be mentioned a chemically-amplified positive resist composition, characterized in that the sulfonium salt is a triaryl sulfoniums salt shown by the following general formula (7) as a specific embodiment of the sulfonium salt.

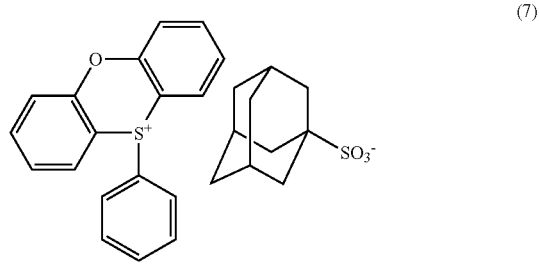

(7)

Further, the present invention is the chemically-amplified positive resist composition as mentioned above to be used for an electron beam lithography.

Although an electron beam resist requires a long exposure time, a fine resist pattern with a small variance of line width may be formed by the resist of the present invention even with a long exposure time.

In addition, the present invention is a resist patterning process on a processing substrate by using the resist composition of a chemically-amplified as mentioned above.

A particularly preferable processing substrate to be used is a photo mask blank.

A light-shielding film of a photo mask blank is formed by a reactive spattering, and in that case a footing profile is easily formed in a resist pattern especially when a material containing a chrome-type or a nitrogen-containing silicon-type material is made in the outer-most surface. However, a desirable pattern profile may be obtained when the resist composition of the present invention is used for pattern formation.

There may be mentioned, as a further preferable processing substrate, a photo mask blank whose outer-most surface material is a chrome compound. Change of a pattern profile as mentioned above is problematic especially on a film of a chrome compound, and thus the patterning process of the present invention may be used advantageously.

According to the present invention, a resist pattern with an excellent solubility, a little variance in line width and form-deterioration even with a long PED time, a good pattern profile form after development, and a high resolution suitable for a fine processing may be obtained by blending to a chemically-amplified type resist composition a sulfonium salt compound that generates an 1-admantane sulfonic acid represented by the above formula (5) by a light-exposure, specifically a sulfonium salt compound shown by the above formula (6), as an photo acid generator.

Especially when a compound shown by the above formula (7) is used, a composition having a good balance of a high resolution power and a low variance of line width may be obtained even though they tend to become a trade-off relationship. In addition, by using a resist composition of the present invention, a resist pattern with a high resolution power, an excellent pattern profile, and a high precision resist pattern with a small variance in line width may be obtained. Accordingly, manufacturing of a VLSI or a precision processing of a photo mask for manufacturing a VLSI may become possible by a lithography using a beam exposure including an electron beam lithography.

BRIEF DESCRIPTION OF THE DRAWING

FIG. 1 shows a nuclear magnetic resonance spectrum of PAG F.

DETAILED DESCRIPTION OF THE PREFERRED EMBODIMENTS

In the present invention, a resist composition was prepared by combining, as a photo acid generator, a sulfonium salt compound generating 1-adamantane sulfonic acid which is a relatively weak acid as a sulfonic acid, and a copolymer of a hydroxystyrene monomer protected by an acetal group which is highly reactive and causes a large solubility change by elimination and an aromatic cyclic olefin such as indene and acenaphthylene. And then, this composition was found to give great effects especially in a lithography of an electron beam drawing, as shown by a little variance in line width and form-deterioration even if the delay time from a light-exposure to a post-treatment (the time for a post-exposure delay) is prolonged, a good pattern profile with a small substrate-dependency, and a high resolution suitable for fine processing.

A base polymer (A) used in a resist composition of the present invention is a polymer containing one or more monomer unit represented by the following general formula (1) (however, it always contains a unit with t being one or more):

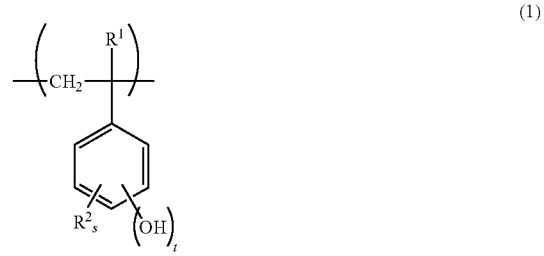

(1)

wherein $R^1$ represents a hydrogen atom or a methyl group; and $R^2$ represents an alkyl group, or an alkoxy group having 1 to 6 carbon atoms, wherein t represents an integer of 0 to 2; and s represents an integer of 0 to 4, and further, one or more monomer unit represented by the following general formula (2);

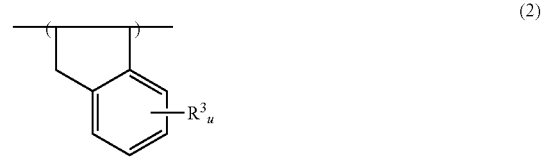

(2)

wherein $R^3$ represents any of a hydroxyl group, an alkyl group, and an alkoxy group having 1 to 6 carbon atoms, wherein u represents an integer of 0 to 4 and/or one or more monomer unit represented by the following general formula (3);

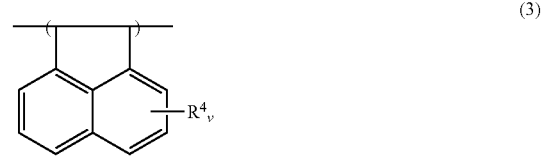

(3)

wherein $R^4$ represents any of a hydroxyl group, an alkyl group, and an alkoxy group having 1 to 6 carbon atoms, wherein v represents an integer of 0 to 4.

The sum of units represented by the general formulae (1) to (3) is preferably 95 or more by mol %, more preferably 98 or more by mol %, and further more preferably 100%, relative to total monomer units in the polymer. In addition, a monomer unit represented by the above general formula (1) containing one or more monomer unit always contains a unit with t being one or more, and when two or more kinds of a monomer unit represented by the general formula (1) is contained, the content of the unit with t being one or more is 70 or more by mol % preferably 85 or more by mol %, and more preferably 100 mol %, relative to total units represented by the above general formula (1).

Basic skeleton of the base polymer as mentioned above is composed of mainly any of the following; a styrene unit (the above general formula (1)) and an indene unit (the above general formula (2)); a styrene unit and an acenaphthylene unit (the above general formula (3)); or a styrene unit, the indene unit, and the acenaphthylene unit. Optionally, it may contain other unit such as a (meth)acrylic acid ester protected by an acid labile group such as tertiary alkyl group or by an acid-stable group.

The styrene unit contains a hydrogen group or a methyl group in its α-position ($R^1$), and the unit containing a hydroxyl group optionally protected by an acid labile group is in the amount of preferably 70 or more by mol %, more preferably 80 or more by mol %, and further more preferably 100 mol %, relative to total styrene units. Further, in a polymer protected by an acid labile group, the content of a unit having an unprotected hydroxyl group is 5 or more by mol % and 80 or less by mol %, and preferably 30 or more by mol % and 80 or less by mol %, relative to total monomer units of the polymer. The content of a unit having a hydroxyl group protected by an acid labile group as mentioned above is more than 0 mol % and 50 or less by mol %, and more preferably 10 or more by mol % and 30 or less by mol %, relative to total monomer units of the polymer.

Other substituent group optionally substituted in the styrene unit may be exemplified by an alkyl group or an alkoxy group having 1 to 6 carbon atoms. Examples of the alkyl group include a methyl group, an ethyl group, a propyl group, a butyl group, a pentyl group, a cyclopentyl group, a hexyl group, and a cyclohexyl group including its isomers. Examples of the alkoxy group include similarly a methoxy group, an ethoxy group, a propoxy group, a butoxy group, a pentoxy group, a cyclopentoxy group, a hexyloxy group, and a cyclohexyloxy group including its isomers.

Any of the indene unit and the acenaphthylene unit may be substituted by a hydroxyl group, a hydrocarbon group, or an alkoxy hydrocarbon group having 1 to 6 carbon atoms. Examples of the hydrocarbon group include a methyl group, an ethyl group, a propyl group, a butyl group, a pentyl group, a cyclopentyl group, a hexyl group, a cyclohexyl group, and a phenyl group including its isomers. As disclosed in Japanese Patent Laid-Open Publication No. 2005-326833, these units render a high etching resistance to a resist film obtained from a resist composition, and in addition, it is assumed from the results of the present invention that they also render a high resolution and an effect to give a desirable pattern profile in a combination with an acid generator which will be mentioned later. The content of these units is preferably 5 to 30 mol %, and more preferably 5 to 20 mol %, relative to total monomer units in the polymer. When the content is less than 5 mol %, the property that an etching resistance is high is not clearly seen, and when the content is more than 30 mol %, to control its molecular weight and to have reproducibility of polymerization become difficult.

The weight-average molecular weight of the base polymer as mentioned above to be used is 3,000 to 20,000 as measured by a generally used method using a gel permeation chromatography (GPC) with polystyrene as a standard sample, and its molecular weight distribution (Mw/Mn) is preferably 1.0 to 2.0, in particular in a narrow dispersion range of 1.0 to 1.8. When the molecular weight distribution is wide, there are risks of forming, after development, foreign spots on a pattern and deteriorating a pattern profile in a certain case.

As an acid labile group, which protects a hydroxyl group in the above general formula (1) and is decomposable by an acid, an acetal group represented by the following general formula (4) is used:

(4)

wherein $R^5$ represents a hydrogen atom, or a linear, a branched, or a cyclic alkyl group having 1 to 10 carbon atoms. Although Y in the general formula (4) is a linear, a branched, or a cyclic (including polycyclic) alkyl group having 1 to 30 carbon atoms, preferably it includes a polycyclic alkyl group having 7 to 30 carbon atoms in order to obtain a high resolution. When Y includes a polycyclic alkyl group, it is preferable for a secondary carbon atom constituting the polycyclic structure to form a bond with an acetal oxygen atom. Because, if the bond is formed on a tertiary carbon atom in a cyclic structure, a polymer becomes labile, thereby lacking in a storage stability as a resist composition and sometimes leading to deterioration of a resolution power. On the other hand, if Y is bonded on a primary carbon atom via a linear alkyl group having one or more carbon atom, a glass transition-temperature (Tg) of the polymer is lowered, thereby risking to deteriorate a resist pattern profile by baking after development in a certain case.

As a preferable general formula (4), the following groups may be exemplified.

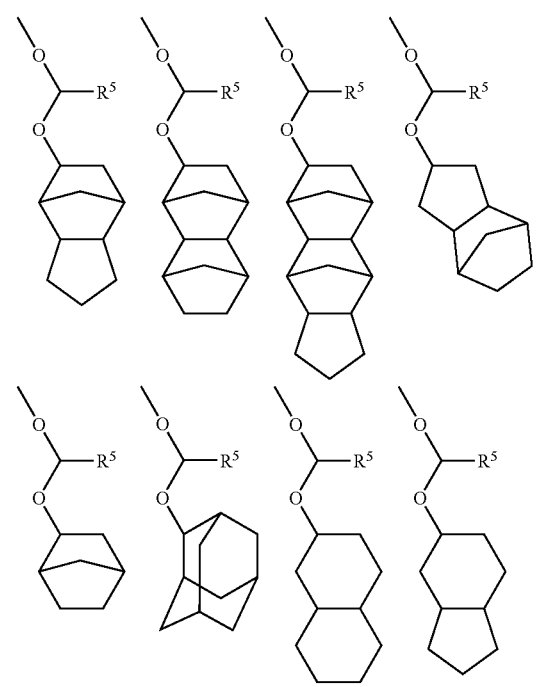

Here, $R^5$ represents a hydrogen atom, or a linear, a branched, or a cyclic alkyl group having 1 to 10 carbon atoms, and may be arbitrarily selected according to design of sensitivity of the decomposable group to an acid. For example, when the design is made to decompose by a strong acid with securing a relatively high stability, a hydrogen atom may be selected. When the design is made to have a high sensitivity to a change in pH by utilizing a relatively high reactivity, a linear alkyl group may be selected. When a relatively bulky alkyl group is substituted at a terminal as shown in the above, which is designed to cause a large change in solubility by decomposition, a carbon atom having a bond with the acetal carbon as $R^5$ is preferably a secondary carbon, though it depends on a combination of an acid generator and a basic compound contained in a resist composition. Examples of $R^5$ bonded with an acetal carbon by a secondary carbon include an isopropyl group, a sec-butyl group, a cyclopentyl group, and cyclohexyl group.

Production of the polymer as mentioned above may be done by a number of polymerization methods already known, namely by a radical polymerization method and a cationic polymerization method. When the polymer is produced by a radical polymerization, a monomer pre-introduced by an acid-decomposable group (in this case, an acid-decomposable protection group is introduced to a phenolic OH group) is used, in a similar manner to polymerization of a (meth) acrylic acid derivative already protected by an acid-decomposable group (for example, Japanese Patent Laid-Open Publication No. 2002-62652), and as to a unit having a free phenolic hydroxyl group, there is also a method in which polymerization is performed in the state of acetoxylated, and then de-acetoxylation is performed. However, when a cationic polymerization is performed or protection is made by a sensitive acetal group, a method in which a polymer without protection is produced by polymerization and then followed by its protection is preferable.

The above-mentioned radical polymerization method and de-acetoxylation reaction are well known, and are also disclosed in Japanese Patent Laid-Open Publication No. 2008-95009 and Japanese Patent Laid-Open Publication No. 2007-132998. As a base for an alkaline hydrolysis, an aqueous ammonia solution, triethyl amine, and the like may be used. The reaction temperature is 20 to 100° C., and preferably 0 to 60° C., and the reaction time is 0.2 to 100 hours, and preferably 0.5 to 30 hours.

As a method for protecting a polymer after polymerization, a method using a vinyl ether and an acid catalyst (for example, Japanese Patent Laid-Open Publication No. 2008-95009), a method using an acetal-forming agent containing a haloalkoxy group and a base (for example, Japanese Patent Laid-Open Publication No. 2007-132998), and the like are known, and any of them may be used here.

For example, in the case of a method using a vinyl ether and an acid catalyst, the acid catalyst to be used in the reaction may be exemplified by methanesulfonic acid, trifluoroacetic acid, oxalic acid, methanesulfonic acid pyridine salt, and the like. The reaction temperature is preferably 5 to 20° C., and the reaction time is 0.2 to 10 hours and preferably 0.5 to 5 hours.

In the case of a method using an acetal-forming agent having a haloalkoxy group and a base, an acetal-forming agent represented by the following general formula (8) is added dropwise into a polymer solution in the presence of a basic compound such as triethyl amine and the like. The reaction temperature is preferably −20 to 50° C., and the reaction time is 0.2 to 10 hours and preferably 0.5 to 5 hours, though they are rough indications, and thus the method is not restricted to these production methods:

wherein X represents a chlorine atom, a bromine atom, and an iodine atom; and Y″ represents an alkyl group or an aryl group having 1 to 30 carbon atoms.

In addition to a base polymer, other polymer may be added exceptionally. For example, a polymer containing, as an alkaline-soluble group, a hydroxyl group with improved acidity due to a presence of a fluorine atom near to it, such as a (meth)acrylate ester type (Japanese Patent Laid-Open Publication No. 2007-297590) and a hydroxystyrene type (Japanese Patent Laid-Open Publication No. S62-240953), has been known. These materials change a state of a resist film surface and have an effect to improve an inner homogeneity of a pattern surface. In addition, a generally used polymer such as hydroxystyrene-(meth)acrylate ester copolymer may also be added in such a range as not to impair effects of the present invention. The content of such a polymer is preferably not more than 30% by weight, and more preferably 10% or less by weight, relative to total polymers, though it is not necessary to be added if intended only to have the effects of the present invention.

As a photo acid generator of component (B) contained in a resist composition used in the present invention, a sulfonium salt containing a sulfonate anion represented by the following general formula (5) is used:

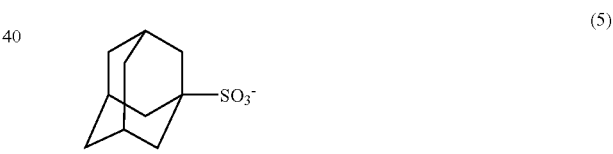

wherein a cation is preferably a triaryl sulfonium salt represented specifically by the following general formula (6);

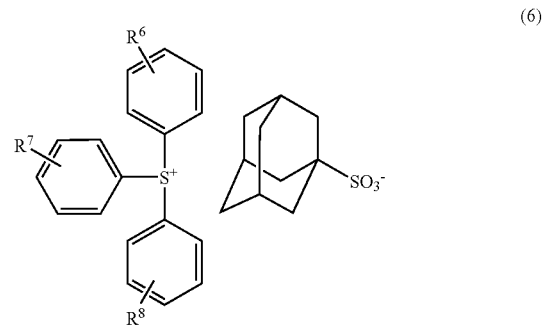

wherein $R^6$, $R^7$, and $R^8$ may be the same or different, and represent, as an independent substituent, a hydrogen atom, a fluorine atom, a chlorine atom, a nitro group, a linear, a branched, or a cyclic alkyl group and an alkoxy group having 1 to 12 carbon atoms which may be substituted or unsubstituted. Specific examples include a hydrogen atom, a methyl group, an ethyl group, a n-propyl group, a sec-propyl group, a cyclopropyl group, a n-butyl group, a sec-butyl group, an iso-butyl group, a tert-butyl group, a methoxy group, an ethoxy group, a n-propyloxy group, a sec-propyloxy group, a n-butyloxy group, a sec-butyloxy group, an iso-butyloxy group, a tert-butyloxy group, a n-hexyl group, a n-hexyloxy group, a n-octyl group, a n-octyloxy group, a n-decyl group, a n-decyloxy group, a n-dodecyl group, and a n-dodecyloxy group. Among them, a hydrogen atom, a methyl group, an ethyl group, a n-hexyloxy group, and a n-octyloxy group are used preferably, while a hydrogen atom and a methyl group are used more preferably. The position of a substituent in the benzenesulfonyl group may be arbitrary and not particularly restricted, but exemplarily a 4-position is preferable.

Among $R^6$ to $R^8$ in the general formula (6), it may also be preferable to form a pair of linkage chain by combinations of two of them. When the linkage chain is formed, it is preferably a single bond or an ether bond. A specific example of it is a triaryl sulfonium salt shown by the following general formula (7):

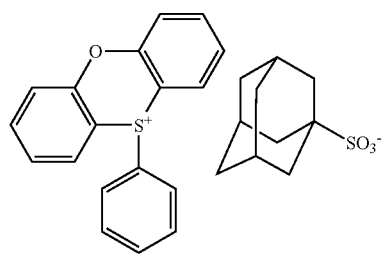

(7)

wherein the above-mentioned sulfonium salt may be used as a mixture of two or more kinds, and also as a mixture with an acid generator as shown below, wherein 67% or more by weight and preferably 80% or more by weight is a sulfonium salt containing a sulfonate anion represented by the above general formula (5) among acid generators used. When acid generators are substantially composed of only a sulfonium salt containing a sulfonate anion represented by the above general formula (5), effects of a resist composition in the present invention are well expressed. When a counter anion is a fluorinated sulfonic acid, the adding amount is preferably 5% or less by weight.

Basically, any of the acid generators mentioned in Japanese Patent Laid-Open Publication No. 2008-95009 and Japanese Patent Laid-Open Publication No. 2007-132998 may be used in the above-mentioned mixture in the range as mentioned above, and they will be briefly explained in the following.

First of all, there may be mentioned onium salts other than those as mentioned above, and a sulfonium salt and an iodonium salt may be exemplified as the onium salts, wherein the substituent group is an aromatic ring or a substituted hydrocarbon group in which an electron-withdrawing group is substituted with a carbon atom to which a sulfur atom or an iodine atom is bonded, and these substituent groups may further have various kinds of substituent groups. Further, a sulfonate counter anion, as mentioned above, if it is other than a sulfonic acid having a group substituted by a fluorine atom or an electron-withdrawing group, may be added till about one-third of the total weight of acid generators and more preferably 20% or less by weight, or may not be added specifically.

Photo acid generators such as a sulfonyl diazomethane and an N-sulfonyl oxydicarboxy imide may be used in the acid generator mixture similarly to the above, and the range of the added amount in terms of a generated sulfonic acid is the same as above. Further, sulfonic acid esters such as an imide sulfonate and an oxime sulfonate are generally used acid generators, and details of them are disclosed in Japanese Patent Laid-Open Publication No. 2008-95009 and Japanese Patent Laid-Open Publication No. 2007-132998.

The amount of the photo acid generator in a chemically-amplified resist composition of the present invention is not particularly restricted, but it is 0.1 to 15 parts by weight, and preferably 2.0 to 10.0 parts by weight, relative to 100 parts by weight of a base polymer in a resist composition. When the amount of the photo acid generator is too much, there are risks of deterioration of a resolution power and formation of foreign materials during development and resist strip. These photo acid generators may be used singly or as a mixture of two or more kinds. Further, by using a photo acid generator having low transmittance at a light-exposure wavelength, transmittance in a resist film may be controlled by its addition amount.

A resist composition used in the present invention further contains a basic compound of component (c). A basic compound capable of suppressing the diffusion rate of an acid generated from a photo acid generator into a resist film is suitable. By blending a basic compound like this, the diffusion rate of an acid in a resist film is suppressed thereby leading to increase in the resolution power, to suppress a sensitivity change after a light-exposure, to reduce dependency on a substrate and an environment, and to improve an exposure margin, a pattern profile, and the like.

The basic compound like this may be exemplified by a primary, a secondary, and a tertiary aliphatic amine, a mixed amine, an aromatic amine, a heterocyclic amine, a nitrogen-containing amine compound having a carboxy group, a nitrogen-containing amine compound having a sulfonyl group, a nitrogen-containing amine compound having a hydroxyl group, a nitrogen-containing amine compound having a hydroxyphenyl group, an alcoholic nitrogen-containing compound, an amide derivative, an imide derivative, and the like.

Specific examples of the primary aliphatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Specific examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, and N,N-dimethyltetraethylene pentamine. Specific examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'- tetramethylmethylene diamine, N,N,N',N'-tetramethylethylene diamine, and N,N,N',N'-tetramethyltetraethylene pentamine.

The mixed amine may be exemplified by dimethylethylamine, methylethylpropylamine, benzylamine, phenetylamine, benzyldimethylamine, and the like. Specific examples of the aromatic amine and the heterocyclic amine include an aniline derivative (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, a pyrrole derivative (such as pyrrole, 2H-pyrrole, 1-methylpyrrole, 2,4-dimethylpyrrole, 2,5-dimethylpyrrole, and N-methylpyrrole), a oxazole derivative (such as oxazole and isooxazole), a thiazole derivative (such as thiazole and isothiazole), an imidazole derivative (such as imidazole, 4-methylimidazole, and 4-methyl-2-phenylimidazole), a pyrazole derivative, a furazan derivative, a pyrroline derivative (such as pyrroline and 2-methyl-1-pyrroline), a pyrrolidine derivative (such as pyrrolidine, N-methylpyrrolidine, pyrrolidinone, and N-methylpyrrolidone), an imidazoline derivative, an imidazolidine derivative, a pyridine derivative (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), a pyridazine derivative, a pyrimidine derivative, a pyrazine derivative, a pirazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, and an uridine derivative.

Further, examples of the nitrogen-containing compound having a carboxy group include amino benzoic acid, indole carboxylic acid, and an amino acid derivative (such as nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine). Examples of the nitrogen-containing compound having a sulfonyl group include 3-pyridinesulfonic acid and pyridinium p-toluenesulfonate. Examples of the nitrogen-containing compound having a hydroxyl group, the nitrogen-containing compound having a hydroxyphenyl group, and the alcoholic nitrogen-containing compound include 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine, ethanol, N-(2-hydroxyethyl)phthalimide, and N-(2-hydroxyethyl)isonicotine amide. Examples of the amide derivative include formamide, N-methyl formamide, N,N-dimethyl formamide, acetamide, N-methyl acetamide, N,N-dimethyl acetamide, propione amide, and benzamide. Examples of the imide derivative include phthalimide, succine imide, and maleimide.

Further, a compound selected from the basic compounds represented by the following general formula (B)-1 may be added singly, or in a combination of two or more kinds:

$$N(X')_n(Y')_{3-n} \quad (B)\text{-}1$$

wherein n represents 1, 2, and 3. The side-chain X' may be the same or different, and represented by the following general formulae (X')-1 to (X')-3;

$$-\!\!\!\!\uparrow\!\! R^{300}\!-\!\!O\!-\!\!R^{301}] \quad (X')\text{-}1$$

$$-\!\!\!\!\uparrow\!\! R^{302}\!-\!\!O\!-\!\!R^{303}\!-\!\!\overset{O}{\underset{\|}{C}}\!-\!\!R^{304}\Big] \quad (X')\text{-}2$$

$$-\!\!\!\!\uparrow\!\! R^{305}\!-\!\!\overset{O}{\underset{\|}{C}}\!-\!\!O\!-\!\!R^{306}\Big] \quad (X')\text{-}3$$

wherein the side chain Y' may be the same or different, and represents a hydrogen atom, a linear, a branched, or a cyclic alkyl group having 1 to 20 carbon atoms, and optionally containing an ether group or a hydroxyl group. Further, X' may form a ring by connecting with each other. Here, each of $R^{300}$, $R^{302}$, and $R^{305}$ represents a linear or a branched alkylene group having 1 to 4 carbon atoms; each of $R^{301}$ and $R^{304}$ represents a hydrogen atom, a linear, a branched, or a cyclic alkyl group having 1 to 20 carbon atoms, and optionally containing one or more kinds of groups selected from a hydroxyl group, an ether group, an ester group, and a lactone ring; $R^{303}$ represents a single bond, a linear or a branched alkylene group having 1 to 4 carbon atoms; and $R^{306}$ represents a linear, a branched, or a cyclic alkyl group having 1 to 20 carbon atoms, and optionally containing one or plural kinds of groups selected from a hydroxyl group, an ether group, an ester group, and a lactone ring.

Specific examples of the compound represented by the general formula (B)-1 include tris(2-methoxymethoxyethyl)amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris{2-[2-(2-hydroxyethoxy)ethoxy]ethyl}amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5,1-aza-18-crown-6, tris(2-formyloxyethyl)amine, tris(2-formyloxyethyl)amine, tris(2-acetoxyyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethyl amine, tris(2-methoxycarbonyloxyethyl)amine, tris(2-tertbutoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl) 2-(methoxycarbonyl)ethyl amine, N,N-bis(2-acetoxyethyl) 2-(methoxycarbonyl)ethyl amine, N,N-bis(2-hydroxyethyl) 2-(ethoxycarbonyl)ethyl amine, N,N-bis(2-acetoxyethyl) 2-(ethoxycarbonyl)ethyl amine, N,N-bis(2-hydroxyethyl) 2-(methoxyethoxycarbonyl)ethyl amine, N,N-bis(2-acetoxyethyl)2-(methoxyethoxycarbonyl)ethyl amine, N,N-bis(2-hydroxyethyl)2-(2-hydroxyethoxycarbonyl)ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl)2-[(methoxycarbonyl)methoxycarbonyl]ethyl amine, N,N-bis(2-hydroxyethyl) 2-(2-oxopropoxycarbonyl)ethyl amine, N,N-bis(2-acetoxyethyl) 2-(2-oxopropoxycarbonyl)ethyl amine, N,N-bis(2-hydroxyethyl)2-(tetrahydrofurfuryloxycarbonyl)ethyl amine, N,N-bis(2-acetoxyethyl)2-(tetrahydrofurfuryloxycarbonyl)ethyl amine, N,N-bis(2-hydroxyethyl)2-[(2-oxotetrahydrofurane-3-yl)oxycarbonyl]ethyl amine, N,N-bis(2-acetoxyethyl) 2-[(2-oxotetrahydrofurane-3-yl)oxycarbonyl]ethyl amine, N,N-bis(2-hydroxyethyl) 2-(4-hydroxybutoxycarbonyl)ethyl amine, N,N-bis(2-formyloxyethyl) 2-(4-formyloxybutoxycarbonyl)ethyl amine, N,N-bis(2-formyloxyethyl)2-(2-formyloxyethoxycarbonyl)ethyl amine, N,N-bis(2-methoxyethyl) 2-(methoxycarbonyl)ethyl amine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butyl bis[2-(methoxycarbonyl)ethyl]amine, N-butyl bis[2-(2-methoxyethoxycarbonyl)ethyl]amine, N-methyl bis(2-acetoxyethyl)amine, N-ethyl bis(2-acetoxyethyl)amine, N-methyl bis(2-pivaloyloxyethyl)amine, N-ethyl bis[2-(methoxycarbonyloxy)ethyl]amine, N-ethyl bis[2-(tert-butoxycarbonyloxy)ethyl]amine, tris(methoxycarbonylmethyl)amine, tris(ethoxycarbonylmethyl)amine, N-butyl bis(methoxycarbonylmethyl)amine, N-hexyl bis(methoxycarbonylmethyl)amine, and β-(diethylamino)-δ-valerolactone, but the compound is not restricted to them.

A basic compound having an amine oxide structure in which a nitrogen atom in the above examples is oxidized may be used as the basic component. Specific examples of it include tris(2-(methoxymethoxy)ethyl)amine oxide, 2,2',2"-nitrirotriethylpropionate N-oxide, and N-2-((2-methoxyethoxy)methoxyethylmorpholine N-oxide.

These basic compounds may be used singly or in a combination of two or more kinds. Its blending amount is 0 to 2 parts by weight, and preferably 0.01 to 2 parts by weight in particular, relative to 100 parts by weight of a solid component in a resist composition. When the amount is more than 3 parts by weight, there is a risk of exceedingly lowering a sensitivity.

Examples of the organic solvent to be blended, as the solvent component of component (D), to a chemically-amplified positive resist composition of the present invention include butyl acetate, amyl acetate, cyclohexyl acetate, 3-methoxybutyl acetate, methyl ethyl ketone, methyl amyl ketone, cyclohexanone, cyclopentanone, 3-ethoxyetyl propionate, 3-ethoxymetyl propionate, 3-methoxymetyl propionate, methyl acetoacetate, ethyl acetoacetate, diacetone alcohol, methyl pilvate, ethyl pilvate, propyleneglycol monomethyl ether, propyleneglycol monoethyl ether, propyleneglycol monomethyl ether propionate, propyleneglycol monoethyl ether propionate, ethyleneglycol monomethyl ether, ethyleneglycol monoethyl ether, diethyleneglycol monomethyl ether, diethyleneglycol monoethyl ether, 3-methyl-3-methoxybutanol, N-methylpyrrolidone, dimethyl sulfoxide, γ-butyrolactone, propyleneglycol methyl ether acetate, propyleneglycol ethyl ether acetate, propylenegylcol propyl ether acetate, methyl lactate, ethyl lactate, propyl lactate, and tetramethylene sulfone, but are not restricted to the above-mentioned solvents. In particular, a propyleneglycol alkyl ether acetate and a lactic acid alkyl ester are preferable. These solvents may be used singly or in a mixture of two or more kinds. A preferable example of the mixed solvent is that of a propyleneglycol alkyl ether acetate and a lactic acid alkyl ester. Here, an alkyl group of a propyleneglycol alkyl ether acetate is the one having 1 to 4 carbon atoms, and for example, a methyl group, an ethyl group, a propyl group, and the like may be mentioned, while a methyl group and an ethyl group are preferable. A propyleneglycol alkyl ether acetate has a 1,2-, and a 1,3-substituted form, and there are three isomers depending on a combination of positions of substituents, wherein they may be used singly or a mixture thereof.

An alkyl group in the lactic acid alkyl ester is the one having 1 to 4 carbon atoms, and may include, for example, a methyl group, an ethyl group, and a propyl group, but a methyl group and an ethyl group are preferable.

When a propyleneglycol alkyl ether acetate is used as the organic solvent, its content is preferably 50% or more by weight relative to total solvents, and when a lactic acid alkyl ester is used, its content is preferably 50% or more by weight relative to total solvents. When a mixed solvent of a propyleneglycol alkyl ether acetate and a lactic acid alkyl ester is used as the solvent, their sum is preferably 50% or more by weight relative to total solvents. The amount of these solvents to be added relative to 100 parts by weight of a solid component in a chemically-amplified positive resist composition is 300 to 2,000 parts by weight, and preferably 400 to 1,000 parts by weight, but not restricted to them as far as the concentration is such that a conventional coating method is applicable.

A resist composition of the present invention may contain a surfactant to obtain a highly smooth resist film when applied. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Flolade FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-

092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). In addition, a surfactant of a polymer obtained by ring-opening polymerization of a partially fluorinated oxetane having a structure as shown below may also be preferably used:

(Surf-1)

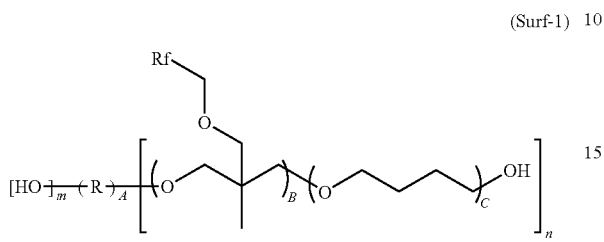

wherein R, Rf, A, B, C, m, and n are applied only to the above formula (surf-1) regardless of whether or not they are mentioned with regard to other than the above-mentioned surfactants. R represents an aliphatic group with a valency of 2 to 4 having 2 to 5 carbon atoms, and specific examples of a 2-valency group include an ethylene group, a 1,4-butylene group, a 1,2-propylene group, a 2,2-dimethyl-1,3-propylene group, and a 1,5-pentylene group. Examples of a 3-valency and a 4-valency group may be exemplified by the following formulae;

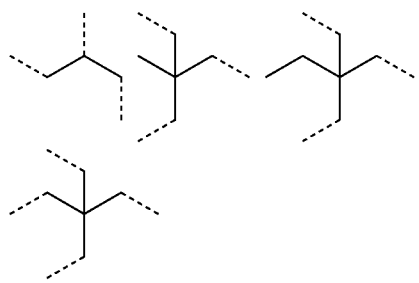

wherein dotted lines represent bonding hands showing partial structures derived from glycerol, trimethylol ethane, trimethylol propane, and pentaerythritol. Among them, 1,4-butylene or 2,2-dimethyl-1,3-propylene are preferably used. Rf represents a trifluoromethyl group or a pentafluoroethyl group, while a trifluoromethyl group is preferable. Here, m represents an integer of 0 to 3; and n represents an integer of 1 to 4, wherein the sum of n and m shows a valency of R and is an integer of 2 to 4. Further, A represents 1; B represents an integer of 2 to 25; and C represents an integer of 0 to 10. Preferably B is 4 to 20, and C is 0 or 1. Each structure unit of the above-mentioned structures does not stipulate their sequences, and may be bonded in a block or randomly. Details with regard to production of surfactants of the polymer type that is obtained by a ring-opening polymerization of a partially fluorinated oxetane are disclosed in U.S. Pat. No. 5,650,483 and so forth. Among them, FC-4430, Surflon S-381, Surfinol E1004, KH-20, KH-30, and a polymer obtained by a ring-opening polymerization of an oxetane as shown in the above structures are preferable. These may be used singly or in a combination of two or more kinds.

The amount of a surfactant to be added in a resist composition of a chemically-amplified type of the present invention is 2 or less parts by weight, and preferably 1 or less part, relative to 100 parts of a base polymer in a resist composition.

When a chemically-amplified positive resist composition of the present invention is used for manufacturing various kinds of integrated circuits, it may be applied to a lithography process by a beam exposure known to those skilled in the art, but especially useful for an electron beam lithography because it is highly reactive to an electron beam and thus has a high sensitivity, and has good temporal stability in vacuum. For example, a chemically-amplified type positive resist composition of the present invention is applied on a substrate (Si, $SiO_2$, SiN, SiON, TiN, WSi, BPSG, SOG, an organic anti-reflection film, and the like) for manufacturing of an integrated circuit and the like or on a photo mask blanks by an arbitrary coating method such as a spin coat, a roll coat, a flow coat, a dip coat, a spray coat, and a doctor coat, in such that a film thickness becomes 0.1 to 2.0 micrometers, and then pre-baked on a hot plate at 60 to 150° C. for 1 to 20 minutes, preferably at 80 to 120° C. for 1 to 10 minutes.

Then, a light beam such as a deep-UV beam, an electron beam, and the like are exposed to form an intended pattern. The exposure dose is about 1 $mJ/cm^2$ to about 200 $mJ/cm^2$ and preferably about 10 $mJ/cm^2$ to about 100 $mJ/cm^2$ in the case of a light beam, and about 0.1 $\mu C/cm^2$ to about 20 $\mu C/cm^2$ and preferably about 3 $\mu C/cm^2$ to about 10 $\mu C/cm^2$ in the case of an electron beam. On a hot plate, a post-exposure bake (PEB) is done at 60 to 150° C. for 1 to 20 minutes, preferably at 80 to 120° C. for 1 to 10 minutes.

Then, the development is made using a developer of an aqueous alkaline solution, preferably tetramethyl ammonium hydroxide (TMAH) and the like, with a concentration of 0.1 to 5%, more preferably 2 to 3%, by a conventional techniques such as a dip method, a puddle method, and a spray method, for 0.1 to 3 minutes, preferably for 0.5 to 2 minutes. With this, a resist of a light-exposed area of a resist film is dissolved because an acid labile group of a polymer body is dissociated by an acid, while an unexposed area remains without being dissolved, thereby forming an intended positive pattern on a substrate.

When a resist pattern as mentioned above is formed on a photo mask blank to produce a photo mask, especially in processing of a photo mask blank having a chrome-type material as the material of the outermost surface, a resist patterning process of the present invention may be advantageously used because a resist pattern is not easily affected by a substrate dependent property. Further, also when a resist pattern is formed on a material containing an oxygen atom and a nitrogen atom in silicone, including a molybdenum-silicon compound, a photo mask with a high reliability may be produced because a high resolution power and a high temporal stability may be obtained.

Any publicly known method may be used for processing of a photo mask blank using an above-mentioned resist pattern as an etching mask, but, in general, an oxygen-containing chlorine-type dry etching is used when the outermost surface is a chrome-type compound, and a fluorine-type dry etching is used when the outermost surface is formed of a transition metal—a silicon compound.

EXAMPLES

In the following, the present invention will be explained specifically by using Synthesis Examples and Examples, but the present invention is no restricted to the below-mentioned.

Synthesis Example 1

Synthesis of Triphenyl Sulfonium Chloride

Into 400 g of dichloromethane was dissolved 40 g (0.2 mole) of diphenyl sulfoxide, and the resulting solution was agitated under ice-cool. And then, 65 g (0.6 mole) of trimethyl silyl chloride was added dropwise at the temperature not exceeding 20° C., at which temperature the mixture was aged for 30 minutes. Thereafter, a Grignard agent prepared separately from 14.6 g (0.6 mole) of a metal magnesium, 67.5 g (0.6 mol) of chlorobenzene, and 168 g of tetrahydrofurane (THF) was added dropwise into it at the temperature not exceeding 20° C. After the reaction mixture was aged for one hour, it was added by 50 g of water at the temperature not exceeding 20° C. to terminate the reaction, and then further by 150 g of water, 10 g of 12-N hydrochloric acid, and 200 g of diethyl ether. A water layer was taken out by separation and washed by 100 g of diethyl ether to obtain an aqueous triphenyl sulfonium chloride solution. This was used in the subsequent reaction without isolation procedures further.

Synthesis Example 2

Synthesis of 4-tert-butylphenyl diphenyl sulfonium bromide

The intended compound was obtained by a similar manner to that in Synthesis Example 1 except that 4-tert-butylbromobenzene was used instead of chlorobenzene and the amount of water in the extraction was increased.

Synthesis Example 3

Synthesis of 4-tert-butoxyphenyl diphenyl sulfonium chloride

The intended compound was obtained by a similar manner to that in Synthesis Example 1 except that 4-tert-butoxychlorobenzene was used instead of chlorobenzene, a dichloromethane solvent containing 5% by weight of triethylamine was used as the solvent, and the amount of water in the extraction was increased.

Synthesis Example 4

Synthesis of tris(4-methylphenyl)sulfonium chloride

The intended compound was obtained by a similar manner to that in Synthesis Example 1 except that bis(4-methylphenyl)sulfoxide instead of diphenyl sulfoxide and 4-chlorotoluene instead of chlorobenzene were used, and the amount of water in the extraction was increased.

Synthesis Example 5

Synthesis of tris(4-tert-butylphenyl)sulfonium bromide

The intended compound was obtained by a similar manner to that in Synthesis Example 1 except that bis(4-tert-butylphenyl)sulfoxide instead of diphenyl sulfoxide and 4-tert-butylbromobenzene instead of chlorobenzene were used, and the amount of water in the extraction was increased.

Synthesis Example 6

Synthesis of phenoxathiin-S-oxide

Into 1600 g of acetic acid was dissolved 100 g (0.5 mole) of phenoxathiin, and 48.5 g (0.5 mole) of an aqueous hydrogen peroxide (35%) was added into it dropwise at room temperature. The mixture was agitated at room temperature for 7 days, and then added by 3,000 g of water to precipitate white crystals. They were collected by filtration and dried under reduced pressure to obtain the intended compound. The amount of the white crystals was 90 g and the yield was 83%.

Synthesis Example 7

Synthesis of 10-phenylphenoxathiinium iodide

An aqueous 10-phenylphenoxathiinium chloride solution was obtained by using phenoxathiin-S-oxide obtained in Synthesis Example 6 instead of diphenyl sulfoxide used in Synthesis Example 1. Sodium iodide was added into this solution to crystallize the sulfonium salt, which was filtered and dried to obtain the intended compound.

Synthesis Example 8

Synthesis of triphenyl sulfonium 1-adamantane sulfonate (PAG A)

The aqueous triphenyl sulfonium chloride solution (0.0167 mole) obtained in Synthesis Example 1 and 0.0167 mole of 1-adamantane sulfonic acid monohydrate were mixed in 100 g of dichloromethane. After the mixture was filtered to remove insoluble matters, an organic layer was taken and washed by 20 g of water for four times. After the solvent was removed under reduced pressure, diethyl ether was added to residual matters for crystallization. Yield was 2.9 g (36%).

Synthesis Example 9

Synthesis of 10-phenylphenoxathiinium 1-adamantane sulfonate (PAG F)

10-Phenylphenoxathiinium iodide 39.8 g (0.098 mole) obtained by Synthesis Example 7 was dissolved in 300 g of methanol, and then 13.1 g (0.049 mole) of lead carbonate and 25.6 g (0.11 mole) of 1-adamantane sulfonic acid monohydrate were added into it, and the resulting mixture was heated to 70° C. After the mixture was set aside for cooling, precipitates were removed by filtration, and the solvent layer was distilled out under vacuum. Residual matters thus obtained were added by 500 g of dichloromethane, washed by 100 g of water, and then the solvent layer was evaporated under reduced pressure. After residual matters were added by diisopropyl ether for crystallization, the resulting crystals were collected by filtration and dried. Analysis showed the rate of the introduced anion was about 90%, and thus the above procedures were repeated again to obtain the intended product as a monohydrate. Yield was 27.3 g (57%).

An infrared absorption spectrum (IR) of the synthesized product as mentioned above (PAG F) shows following absorption peaks. IR (cm$^{-1}$)

3444, 3066, 2937, 2908, 2848, 1589, 1579, 1463, 1454, 1438, 1274, 1226, 1199, 1186, 1176, 1160, 1124, 1106, 1083, 1012, 997, 883, 777, 754, 680, 626

A nuclear magnetic resonance spectrum (1H-NMR, DMSO solvent) of this product (PAG F) is shown in FIG. 1.

Synthesis Examples of 10 to 13 (PAG B, C, D, and E)

From the sulfonium salts mentioned in Synthesis Examples 2 to 5, or after the sulfonium salts were ion-exchanged, onium salts containing 1-adamantane sulfonate were synthesized in a similar manner to those in Synthesis Examples 8 and 9. Each of the onium salts obtained by Synthesis Examples 10, 11, 12, and 13 are designated as PAG B, C, D, and E, respectively. They, including PAG A and PAG F as mentioned above, are shown by the following formulae.

[PAG A]

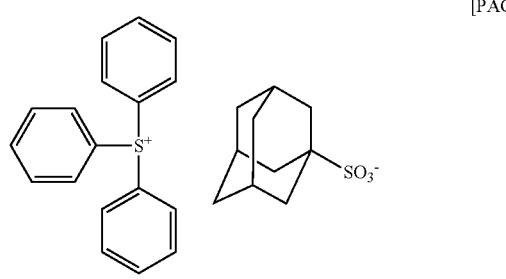

[PAG B]

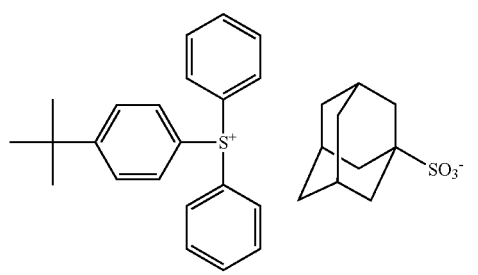

[PAG C]

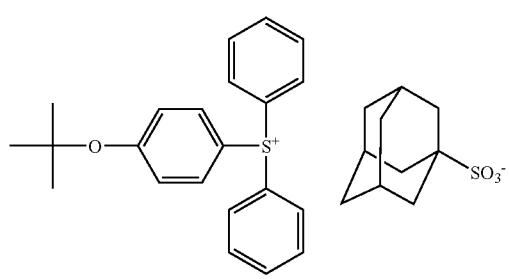

[PAG D]

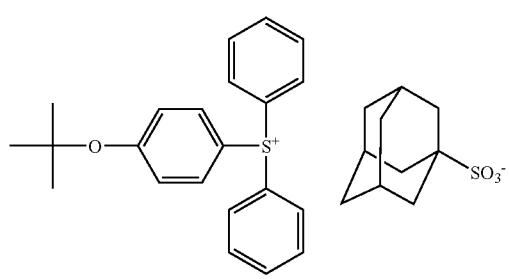

[PAG E]

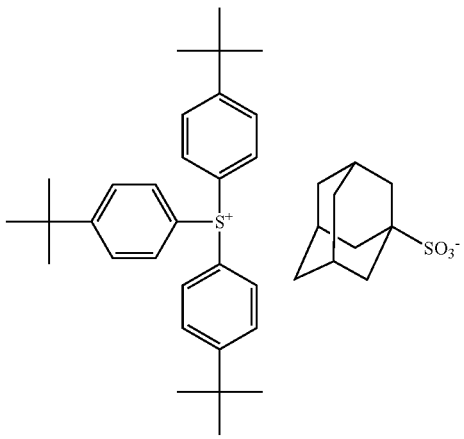

[PAG F]

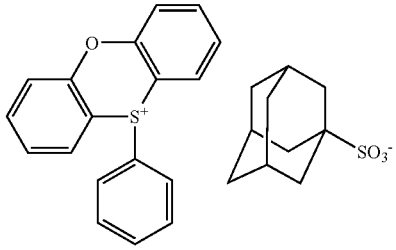

Resist compositions shown in Tables 1 to 3 were prepared. Values in the Tables show weight ratios of the mixtures. Resist composition shown in Tables 1 to 3 are as follows.

Polymer 1: hydroxystyrene-indene-ethoxyethoxystyrene copolymer (hydroxystyrene:indene:ethoxyethoxystyrene=63.2:10.5:26.3, weight-average molecular weight (Mw)=14,100, molecular weight distribution (Mw/Mn)=1.73)

Polymer 2: hydroxystyrene-indene-methoxyisobutoxystyrene copolymer (hydroxystyrene:indene:methoxyisobutoxystyrene=66.1:10.5:23.4, weight-average molecular weight (Mw)=15,200, molecular weight distribution (Mw/Mn)=1.70)

Polymer 3: hydroxystyrene-indene-norbornyloxyisobutoxystyrene copolymer (hydroxystyrene:indene:norbornyloxyisobutoxystyrene=79.4:10.5:10.1, weight-average molecular weight (Mw)=16,200, molecular weight distribution (Mw/Mn)=1.77)

Polymer 4: hydroxystyrene-acenaphthylene-methoxyisobutoxystyrene copolymer (hydroxystyrene:acenaphthylene:methoxyisobutoxystyrene=65.7:10.2:24.1, weight-average molecular weight (Mw)=15,500, molecular weight distribution (Mw/Mn)=1.72)

Polymer 5: hydroxystyrene-styrene-ethoxyethoxystyrene copolymer (hydroxystyrene:styrene:ethoxyethoxystyrene=62.2:10.8:27.0, weight-average molecular weight (Mw)=15,600, molecular weight distribution (Mw/Mn)=1.69)

Polymer 6: hydroxystyrene-styrene-1-ethylcyclopentyl methacrylic acid ester copolymer (hydroxystyrene:styrene:1-ethylcyclopentyl methacrylic acid ester=68.4:10.7:20.9, weight-average molecular weight (Mw)=13,900, molecular weight distribution (Mw/Mn)=1.66)

Acid Generators

PAG A, PAG B, PAG C, PAG D, PAG E, and PAG F: as mentioned in Synthesis Examples PAG G: triphenyl sulfonium 2,4,6-triisopropylbenzene sulfonate PAG H: triphenyl sulfonium camphor sulfonate
PAG I: 10-phenylphenoxathiinium 2,4,6-triisopropylbenzene sulfonate
Basic Compound 1: tris[2-(methoxymethoxy)ethyl]amine
Surfactant 1: FC-4430 (manufactured by Sumitomo 3M Ltd.)
Surfactant 2: 3-methyl-3-(2,2,2-trifluoroethoxymethyl)oxethane-tetrahydrofurane-2,2-dimethyl-1,3-propanediol copolymer (manufactured by Omnova, Inc.). Its structure is shown below (surf-2):

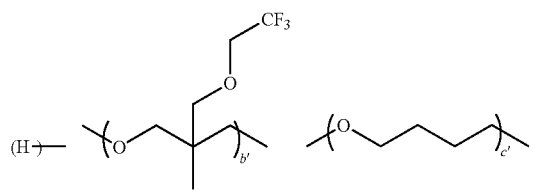

(surf-2)

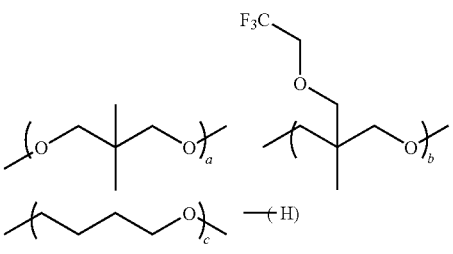

Here, $a:(b+b'):(c+c')=1:4$ to $7:0.01$ to $1$ (mol ratio), and weight-average molecular weight is 1,500.

Solvent 1: propyleneglycol methyl-ether acetate
Solvent 2: ethyle lactate

[Table 1]

TABLE 1

| Composition | Ex. 1 | Ex. 2 | Ex. 3 | Ex. 4 | Ex. 5 | Ex. 6 | Ex. 7 | Ex. 8 |
|---|---|---|---|---|---|---|---|---|
| Polymer 1 | 80 | 80 | | | | | | |
| Polymer 2 | | | 80 | 80 | 80 | 80 | 80 | 80 |
| Polymer 3 | | | | | | | | |
| Polymer 4 | | | | | | | | |
| Polymer 5 | | | | | | | | |
| Polymer 6 | | | | | | | | |
| PAG A | 8 | | 8 | | | | | |
| PAG B | | | | 8 | | | | |
| PAG C | | | | | 8 | | | |
| PAG D | | | | | | 8 | | |
| PAG E | | | | | | | 8 | |
| PAG F | | 8 | | | | | | 8 |
| PAG G | | | | | | | | |
| PAG H | | | | | | | | |
| PAG I | | | | | | | | |
| Basic compound 1 | 0.4 | 0.4 | 0.4 | 0.4 | 0.4 | 0.4 | 0.4 | 0.4 |
| Surfactant 1 | 0.1 | 0.1 | 0.1 | 0.1 | | 0.1 | 0.1 | |
| Surfactant 2 | | | | | 0.1 | | | 0.1 |
| Solvent 1 | 540 | 540 | 540 | 540 | 540 | 540 | 540 | 540 |
| Solvent 2 | 1280 | 1280 | 1280 | 1280 | 1280 | 1280 | 1280 | 1280 |

TABLE 2

| Composition | Ex. 9 | Ex. 10 | Ex. 11 | Ex. 12 | Com. Ex. 1 | Com. Ex. 2 | Com. Ex. 3 |
|---|---|---|---|---|---|---|---|
| Polymer 1 | | | | | | | |
| Polymer 2 | | | | | 80 | 80 | 80 |
| Polymer 3 | 80 | | 80 | | | | |
| Polymer 4 | | 80 | | 80 | | | |
| Polymer 5 | | | | | | | |
| Polymer 6 | | | | | | | |
| PAG A | 8 | 8 | | | | | |
| PAG B | | | | | | | |
| PAG C | | | | | | | |
| PAG D | | | | | | | |
| PAG E | | | | | | | |
| PAG F | | | 8 | 8 | | | |
| PAG G | | | | | 8 | | |
| PAG H | | | | | | 8 | |
| PAG I | | | | | | | 8 |
| Basic compound 1 | 0.4 | 0.4 | 0.4 | 0.4 | 0.4 | 0.4 | 0.4 |
| Surfactant 1 | 0.1 | 0.1 | 0.1 | 0.1 | 0.1 | 0.1 | 0.1 |
| Solvent 1 | 540 | 540 | 540 | 540 | 540 | 540 | 540 |
| Solvent 2 | 1280 | 1280 | 1280 | 1280 | 1280 | 1280 | 1280 |

TABLE 3

| Composition | Com. Ex. 4 | Com. Ex. 5 | Com. Ex. 6 | Com. Ex. 7 |
|---|---|---|---|---|
| Polymer 1 | | | | |
| Polymer 2 | | | | |
| Polymer 3 | | | | |
| Polymer 4 | | | | |
| Polymer 5 | 80 | 80 | | |
| Polymer 6 | | | 80 | 80 |
| PAG A | 8 | | 8 | |
| PAG B | | | | |
| PAG C | | | | |
| PAG D | | | | |
| PAG E | | | | |
| PAG F | | 8 | | 8 |
| PAG G | | | | |
| PAG H | | | | |
| PAG I | | | | |
| Basic compound 1 | 0.4 | 0.4 | 0.4 | 0.4 |
| Surfactant 1 | 0.1 | 0.1 | 0.1 | 0.1 |
| Solvent 1 | 540 | 540 | 540 | 540 |
| Solvent 2 | 1280 | 1280 | 1280 | 1280 |

Each of the resist compositions shown in Tables was dissolved in each solvent according to Tables. Each of the obtained resist compositions was filtered through a filter with 0.2 micrometer pore size made of a nylon resin, and then this resist solution was applied on a silicon wafer whose surface was laminated by Cr as a photo mask blank model by spin coating in such a manner as to give 0.15 micrometer in thickness.

Then, this silicon wafer was baked on a hot plate at 110° C. for 4 minutes, exposed by an electron beam irradiator (HL-800D, manufactured by Hitachi Hitechnologies Co., Ltd., acceleration voltage of 50 keV), baked at 110° C. for 4 minutes as PEB (PEB: post exposure bake), and then developed by an aqueous 2.38% tetramethyl ammonium hydroxide to obtain a positive pattern (Examples 1 to 12, and Comparative Examples 1 to 7).

Resist patterns thus obtained were evaluated as following. Exposure dose to resolve a top and a bottom of 1:1 line-and-space with 0.20 micrometer was taken as an optimum exposure dose (sensitivity: Eop), and the resolved minimum line width of the line-and-space whose resist pattern was separated with this exposure dose was taken as the resolution of the evaluating resist. The resolved resist pattern profile was observed at the cross section of the resist by a scanning electron microscope. To evaluate post exposure delay (PED) under vacuum, it was kept, after light-exposure by an electron beam irradiator, in the instrument for 24 hours under vacuum and then performed the PEB and the development. The obtained line width in Eop of the 0.2 micrometer line-and-space was compared to the line width baked immediately after the light-exposure. This difference is shown in the unit of nanometer.

Evaluation results of each pattern profile on a Cr-laminated silicon wafer are also shown in Table 4.

TABLE 4

| | Eop (μC/cm²) | Limiting resolution (nm) | PED under vacuum (nm) | Pattern profile |
|---|---|---|---|---|
| Example 1 | 7.8 | 80 | 5.2 | Slightly rounding profile |
| Example 2 | 8.5 | 75 | 2.6 | Rectangular |
| Example 3 | 9.1 | 70 | 4.4 | Rectangular |
| Example 4 | 8.8 | 75 | 2.3 | Rectangular |
| Example 5 | 9.2 | 80 | 1.7 | Rectangular |
| Example 6 | 9.3 | 75 | 1.6 | Rectangular |
| Example 7 | 10.1 | 80 | 1.5 | Slightly negative profile |
| Example 8 | 8.8 | 70 | 2.2 | Rectangular |
| Example 9 | 10.3 | 70 | 2.8 | Rectangular |
| Example 10 | 9.7 | 70 | 3.1 | Rectangular |
| Example 11 | 9.6 | 70 | 2.5 | Rectangular |
| Example 12 | 9.3 | 65 | 2.9 | Rectangular |
| Comparative Example 1 | 7.9 | 100 | 6 | Concave profile (Constricted middle) |
| Comparative Example 2 | 8.7 | 90 | 4.6 | Footing profile |
| Comparative Example 3 | 9 | 90 | 3.9 | Concave profile (Constricted middle) |
| Comparative Example 4 | 7.7 | 100 | 6.3 | Rounding profile |
| Comparative Example 5 | 8.3 | 90 | 6.1 | Rounding profile |
| Comparative Example 6 | 11.8 | 120 | 7.8 | Negative profile |
| Comparative Example 7 | 12.4 | 110 | 7.3 | Negative profile |

As can be seen in the above, according to the present invention, a resist pattern having an excellent solubility, a little variance in line width and form-deterioration even with a long PED time, a good pattern profile form after development despite on a Cr film, and a high resolution power suitable for a fine processing may be obtained by blending to a chemically-amplified resist composition a sulfonium salt compound that liberates an 1-admantane sulfonic acid represented by the above formula (5) by a light-exposure, specifically a sulfonium salt compound shown by the above formula (6), as a photo acid generator. Therefore, the patterning process according to the present invention may be advantageously applied to a mask blanks having a formed film of a chrome compound.

In addition, especially when a compound shown by the above formula (7) is used, a composition having a good balance of a high resolution and a low variance of line width may be obtained even though they tend to become a trade-off relationship. Further, by using a resist composition of the present invention, a resist pattern with a high resolution, an excellent pattern profile, and a high precision resist pattern with a small variance in line width may be obtained. Accordingly, manufacturing of a VLSI or a precision processing of a photo mask for manufacturing a VLSI may become possible by a lithography using a beam exposure including an electron beam lithography.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:
1. A chemically-amplified positive resist composition comprising, as its main components, at least (A) a base polymer consisting of one or more monomer unit represented by the following general formula (1), the base polymer contains at least one unit with t being one or more:

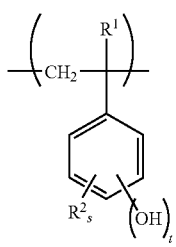
(1)

wherein $R^1$ represents a hydrogen atom or a methyl group; and $R^2$ represents an alkyl group or an alkoxy group having 1 to 6 carbon atoms, wherein t represents an integer of 0 to 2; and s represents an integer of 0 to 4, and one or more monomer unit represented by the following general formula (3);

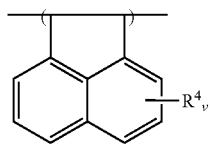
(3)

wherein $R^4$ represents any of a hydroxyl group, an alkyl group, and an alkoxy group having 1 to 6 carbon atoms, wherein v represents an integer of 0 to 4, wherein a hydroxyl group of the general formula (1) is partly protected by an acetal group represented by the following general formula (4);

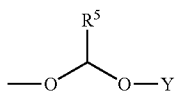
(4)

wherein $R^5$ represents a hydrogen atom, a linear, a branched, or a cyclic alkyl group having 1 to 10 carbon atoms, Y represents a linear or a branched alkyl group having 1 to 30 carbon atoms, and the polymer is insoluble or hardly soluble in an alkaline solution, while soluble in an alkaline solution when deprotected by an acid catalyst, (B) a sulfonium salt containing a sulfonate anion represented by the following general formula (5);

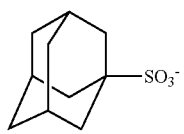
(5)

(C) a basic component, and (D) an organic solvent.

2. The chemically-amplified positive resist composition according to claim 1, wherein a photo acid generator of the component (B) is a triaryl sulfonium salt represented by the following general formula (6):

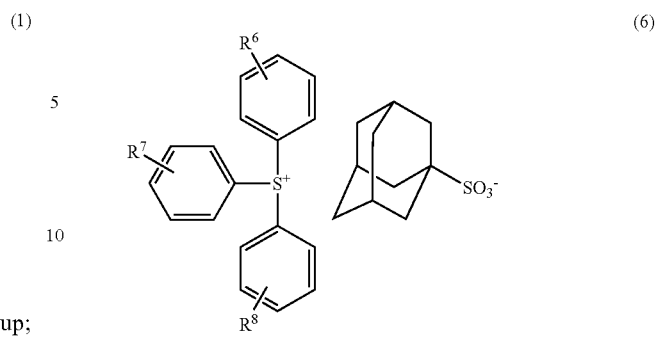
(6)

wherein $R^6$, $R^7$, and $R^8$ may be the same or different, and represent any of a hydrogen atom, a fluorine atom, a chlorine atom, a nitro group, a linear, a branched, or a cyclic alkyl group and an alkoxy group, substituted or unsubstituted, having 1 to 12 carbon atoms, among $R^6$ to $R^8$, a pair of linkage chain is formed by combinations of two of them, and when the linkage chain is formed, it may be a single bond or an ether bond.

3. The chemically-amplified positive resist composition according to claim 2, wherein the sulfonium salt represented by the above general formula (6) is a triaryl sulfonium salt represented by the following general formula (7):

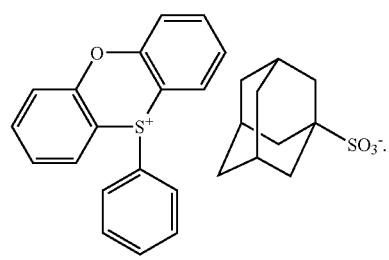
(7)

4. The chemically-amplified positive resist composition according to claim 1, wherein the composition is for an electron beam lithography.

5. The chemically-amplified positive resist composition according to claim 2, wherein the composition is for an electron beam lithography.

6. The chemically-amplified positive resist composition according to claim 3, wherein the composition is for an electron beam lithography.

7. A resist patterning process comprising at least steps of:
applying the chemically-amplified positive resist composition according to claim 1;
conducting exposure; and
developing by using a developer to form a resist pattern on a processing substrate.

8. A resist patterning process comprising at least steps of:
applying the chemically-amplified positive resist composition according to claim 2;
conducting exposure; and
developing by using a developer to form a resist pattern on a processing substrate.

9. A resist patterning process comprising at least steps of:
applying the chemically-amplified positive resist composition according to claim 3;
conducting exposure; and
developing by using a developer to form a resist pattern on a processing substrate.

10. A resist patterning process comprising at least steps of:
applying the chemically-amplified positive resist composition according to claim 4;
conducting exposure; and
developing by using a developer to form a resist pattern on a processing substrate.

11. A resist patterning process comprising at least steps of:
applying the chemically-amplified positive resist composition according to claim 5;
conducting exposure; and
developing by using a developer to form a resist pattern on a processing substrate.

12. A resist patterning process comprising at least steps of:
applying the chemically-amplified positive resist composition according to claim 6;
conducting exposure; and
developing by using a developer to form a resist pattern on a processing substrate.

13. A resist patterning process comprising, at least, a step of applying the chemically-amplified positive resist composition according to claim 1 on a mask blanks, and then removing an excess solvent component remained in a coat film by heating to obtain a resist film; a step of pattern-exposing by a high energy radiation; and a step of developing by using a developer, after a heat-treatment is done after a light-exposure as required.

14. A resist patterning process comprising, at least, a step of applying the chemically-amplified positive resist composition according to claim 2 on a mask blanks, and then removing an excess solvent component remained in a coat film by heating to obtain a resist film; a step of pattern-exposing by a high energy radiation; and a step of developing by using a developer, after a heat-treatment is done after a light-exposure as required.

15. A resist patterning process comprising, at least, a step of applying the chemically-amplified positive resist composition according to claim 3 on a mask blanks, and then removing an excess solvent component remained in a coat film by heating to obtain a resist film; a step of pattern-exposing by a high energy radiation; and a step of developing by using a developer, after a heat-treatment is done after a light-exposure as required.

16. A resist patterning process comprising, at least, a step of applying the chemically-amplified positive resist composition according to claim 4 on a mask blanks, and then removing an excess solvent component remained in a coat film by heating to obtain a resist film; a step of pattern-exposing by a high energy radiation; and a step of developing by using a developer, after a heat-treatment is done after a light-exposure as required.

17. A resist patterning process comprising, at least, a step of applying the chemically-amplified positive resist composition according to claim 5 on a mask blanks, and then removing an excess solvent component remained in a coat film by heating to obtain a resist film; a step of pattern-exposing by a high energy radiation; and a step of developing by using a developer, after a heat-treatment is done after a light-exposure as required.

18. A resist patterning process comprising, at least, a step of applying the chemically-amplified positive resist composition according to claim 6 on a mask blanks, and then removing an excess solvent component remained in a coat film by heating to obtain a resist film; a step of pattern-exposing by a high energy radiation; and a step of developing by using a developer, after a heat-treatment is done after a light-exposure as required.

19. A resist patterning process comprising, at least, a step of applying the chemically-amplified positive resist composition according to claim 1 on a mask blanks having a formed film of a chrome compound; a step, after a heat-treatment, of pattern-exposure by a high energy radiation via a photo mask or pattern-exposure by a high energy beam; and a step of developing by using a developer, after a heat-treatment is done after a light-exposure as required.

20. A resist patterning process comprising, at least, a step of applying the chemically-amplified positive resist composition according to claim 2 on a mask blanks having a formed film of a chrome compound; a step, after a heat-treatment, of pattern-exposure by a high energy radiation via a photo mask or pattern-exposure by a high energy beam; and a step of developing by using a developer, after a heat-treatment is done after a light-exposure as required.

21. A resist patterning process comprising, at least, a step of applying the chemically-amplified positive resist composition according to claim 3 on a mask blanks having a formed film of a chrome compound; a step, after a heat-treatment, of pattern-exposure by a high energy radiation via a photo mask or pattern-exposure by a high energy beam; and a step of developing by using a developer, after a heat-treatment is done after a light-exposure as required.

22. A resist patterning process comprising, at least, a step of applying the chemically-amplified positive resist composition according to claim 4 on a mask blanks having a formed film of a chrome compound; a step, after a heat-treatment, of pattern-exposure by a high energy radiation via a photo mask or pattern-exposure by a high energy beam; and a step of developing by using a developer, after a heat-treatment is done after a light-exposure as required.

23. A resist patterning process comprising, at least, a step of applying the chemically-amplified positive resist composition according to claim 5 on a mask blanks having a formed film of a chrome compound; a step, after a heat-treatment, of pattern-exposure by a high energy radiation via a photo mask or pattern-exposure by a high energy beam; and a step of developing by using a developer, after a heat-treatment is done after a light-exposure as required.

24. A resist patterning process comprising, at least, a step of applying the chemically-amplified positive resist composition according to claim 6 on a mask blanks having a formed film of a chrome compound; a step, after a heat-treatment, of pattern-exposure by a high energy radiation via a photo mask or pattern-exposure by a high energy beam; and a step of developing by using a developer, after a heat-treatment is done after a light-exposure as required.

* * * * *